United States Patent
Lotya et al.

(10) Patent No.: US 10,789,524 B2
(45) Date of Patent: Sep. 29, 2020

(54) SMARTCARD WITH A BOOSTER ANTENNA AND A WIRELESS CONNECTION BETWEEN MODULES

(71) Applicants: Mustafa Lotya, Celbridge (IE); David Finn, Tourmakeady (IE)

(72) Inventors: Mustafa Lotya, Celbridge (IE); David Finn, Tourmakeady (IE)

(73) Assignee: AmaTech Group Limited, Galway (IE)

(*) Notice: Subject to any disclaimer, the term of this patent is extended or adjusted under 35 U.S.C. 154(b) by 0 days.

(21) Appl. No.: 16/798,368

(22) Filed: Feb. 23, 2020

(65) Prior Publication Data

US 2020/0226443 A1    Jul. 16, 2020

Related U.S. Application Data

(63) Continuation-in-part of application No. 16/571,194, filed on Sep. 16, 2019, and a continuation-in-part of
(Continued)

(51) Int. Cl.
    *G06K 19/06* (2006.01)
    *G06K 19/077* (2006.01)
    (Continued)

(52) U.S. Cl.
    CPC . *G06K 19/07794* (2013.01); *G06K 19/07769* (2013.01); *G06K 19/07783* (2013.01); *H01Q 1/2216* (2013.01); *H01Q 1/2225* (2013.01); *H01Q 1/2283* (2013.01); *H01Q 7/00* (2013.01); *H01Q 21/29* (2013.01); *H05K 1/165* (2013.01); *H01F 38/14* (2013.01); *H05K 3/103* (2013.01); *H05K 2201/10098* (2013.01); *Y10T 29/49018* (2015.01); *Y10T 29/49162* (2015.01)

(58) Field of Classification Search
    CPC ....... G06K 19/07794; G06K 19/07769; G06K 19/07783; H01Q 1/2216; H01Q 1/2225; H01Q 1/2283; H01Q 7/00; H01Q 21/29; H05K 1/165
    USPC ....................... 235/492, 487, 375
    See application file for complete search history.

(56) References Cited

U.S. PATENT DOCUMENTS

| 7,711,391 B2 * | 5/2010 | Zatloukal ........... G06K 19/0727 455/558 |
| 7,980,477 B2 | 7/2011 | Finn |

(Continued)

FOREIGN PATENT DOCUMENTS

| FR | 2 776 796 | 1/1999 |
| WO | WO 2004/040507 | 5/2004 |
| WO | WO 2017198842 | 11/2017 |

*Primary Examiner* — Karl D Frech
(74) *Attorney, Agent, or Firm* — Gerald E Linden

(57) ABSTRACT

A wireless connection may be established between at least two electronic modules (M1, M2) disposed in module openings (MO-1, MO-2) of a smartcard so that the two modules may communicate (signals, data) with each other. The connection may be implemented by a booster antenna (BA) having two coupler coils (CC-1, CC-2) disposed in close proximity with the two modules, and connected with one another. The booster antenna may also harvest energy from an external device such as a card reader, POS terminal, or a smartphone, and provide the energy to the two modules via the two coupler coils.

16 Claims, 3 Drawing Sheets

Related U.S. Application Data application No. 16/242,009, filed on Jan. 8, 2019, now Pat. No. 10,762,413, which is a continuation-in-part of application No. 15/969,816, filed on May 3, 2018, now Pat. No. 10,518,518, which is a continuation-in-part of application No. 15/939,281, filed on Mar. 29, 2018, now Pat. No. 10,733,494, which is a continuation-in-part of application No. 15/358,138, filed on Nov. 22, 2016, now Pat. No. 9,960,476, which is a continuation-in-part of application No. 15/072,356, filed on Mar. 17, 2016, now Pat. No. 9,836,684, which is a continuation-in-part of application No. 14/465,815, filed on Aug. 21, 2014, now Pat. No. 9,475,086, which is a continuation-in-part of application No. 14/173,815, filed on Feb. 6, 2014, now Pat. No. 9,195,932, which is a continuation of application No. 14/020,884, filed on Sep. 8, 2013, now Pat. No. 9,033,250.

(60) Provisional application No. 62/731,902, filed on Sep. 16, 2018.

(51) Int. Cl.
*H01Q 1/22* (2006.01)
*H01Q 7/00* (2006.01)
*H05K 1/16* (2006.01)
*H01Q 21/29* (2006.01)
*H05K 3/10* (2006.01)
*H01F 38/14* (2006.01)

(56) References Cited

U.S. PATENT DOCUMENTS

| | | | |
|---|---|---|---|
| 8,840,031 B2 * | 9/2014 | Tudosie | G06K 19/072 |
| | | | 235/492 |
| 9,033,250 B2 | 5/2015 | Finn | |
| 9,390,364 B2 | 7/2016 | Finn | |
| 9,475,086 B2 | 10/2016 | Finn | |
| 9,697,459 B2 | 7/2017 | Finn | |
| 9,798,968 B2 | 10/2017 | Finn | |
| 9,812,782 B2 | 11/2017 | Finn | |
| 9,881,247 B2 | 1/2018 | Le Garrec et al. | |
| 2013/0076477 A1 | 2/2013 | Finn | |
| 2013/0126622 A1 | 5/2013 | Finn | |
| 2014/0091149 A1 | 4/2014 | Finn | |
| 2015/0021402 A1 | 1/2015 | Finn | |
| 2015/0053772 A1 * | 2/2015 | Holweg | G06K 19/07794 |
| | | | 235/492 |
| 2015/0235122 A1 | 8/2015 | Finn | |
| 2015/0356399 A1 | 12/2015 | Finn | |
| 2016/0118711 A1 | 4/2016 | Finn | |
| 2016/0180210 A1 * | 6/2016 | Spears | G06K 19/0723 |
| | | | 235/492 |

* cited by examiner a typical dual-interface smartcard smartcard with two electronic moldules booster antenna (BA) with two coupler coils (CC-1, CC-2)

SMARTCARD WITH A BOOSTER ANTENNA AND A WIRELESS CONNECTION BETWEEN MODULES

CROSS-REFERENCE TO RELATED APPLICATIONS

This application claims priority (filing date benefit) as nonprovisional or continuation-in-part of the following US patent applications . . . .
a continuation-in-part of Ser. No. 16/571,194 filed 16 Sep. 2019
   16571194 is a nonprovisional of 62/731,902 filed 16 Sep. 2018
a continuation-in-part of Ser. No. 16/242,009 filed 8 Jan. 2019
   16242009 is a continuation-in-part of Ser. No. 15/969,816 filed 3 May 2018
   15969816 is a continuation-in-part of Ser. No. 15/939,281 filed 29 Mar. 2018
   15939281 is continuation-in-part of Ser. No. 15/358,138 filed 22 Nov. 2016
   15358138 is a continuation-in-part of Ser. No. 15/072,356 filed 17 Mar. 2016
   15072356 is a continuation-in-part of Ser. No. 14/465,815 filed 21 Aug. 2014
     14465815 is a continuation-in-part of Ser. No. 14/173,815 filed 6 Feb. 2014
     14173815 is a continuation of Ser. No. 14/020,884 filed 8 Sep. 2013

TECHNICAL FIELD

The disclosure relates broadly to RFID devices such as smartcards or transaction cards, and more particularly to cards having two circuits or circuit modules (or simply "modules") which are physically separate from one another.

BACKGROUND

A smart card (SC), chip card, transaction card, or integrated circuit card (ICC), may be any pocket-sized card that has an embedded integrated circuit. In the main, hereinafter, the discussion will focus on smartcards (or, simply "cards").

Smartcards can provide personal identification, authentication, data storage, and application processing.

Smartcards (SC) typically comprise a card body (CB) and a chip module (CM). The card body may measure 85.60 mm×53.98 mm, and have a thickness of 0.76 mm, according to ID-1 of the ISO/IEC 7810 standard.

The card body (CB) of some smartcards may comprise layers of plastic, laminated together.

The chip module (CM) generally comprises a semiconductor chip (IC), which may include a microprocessor and memory.

The chip module (CM) may include a pattern (or array) of contact pads (CP), connected with the semiconductor chip (IC), and exposed on a front surface of the card, to enable an external device (such as a "reader" or POS terminal) with contacts to interact via a physical "contact" interface (ISO 7816) with the semiconductor chip (IC).

When a smartcard (SC) having contact capability is inserted into an external reader, it may be (i) powered by and (ii) communicate with the external device by radio frequency (RF) energy.

The chip module (CM) may comprise a module antenna (MA), which may be connected with semiconductor chip (IC), to enable an external device (such as a "reader" or POS terminal) with its own antenna to interact via a radio frequency (RF) "contactless" interface (ISO 14443 and NFC/ISO 15693) with the semiconductor chip (IC).

A booster antenna (BA) may be embedded in the card body (CB) to enhance the contactless interface. Booster antennas are described in greater detail hereinbelow.

When a smartcard (SC) having contactless capability is brought into close proximity with an external reader it may be (i) powered by and (ii) communicate with the external device by radio frequency (RF) energy.

Some smartcards, generally referred to as "dual interface" or DI smartcards, have both contact and contactless capability.

Powering a device such as a smartcard may be referred to herein as "energy harvesting". A smartcard, which has no battery, and which relies on harvesting energy from an external device, may be referred to as a "passive" card.

Booster Antennas

Generally, a booster antenna (BA) may be formed by embedding a pattern of wire in a plastic layer of the card body (CB). An example of a booster antenna (BA) may be found in U.S. Pat. No. 9,033,250. The booster antenna (BA) may comprise the following components (or portions):

a card antenna (CA) component disposed around a peripheral area of a card body (CB) to interact with the external reader;
   a coupler coil (CC) component disposed at an interior location on the card, more particularly at a location of the transponder chip module (TCM), to interact with the module antenna (MA) of the transponder chip module (TCM); and
   an extension antenna (EA) component extending across an interior area of the card, exclusive of the area occupied by the coupler coil (CC) component, contributing to the inductance of the booster antenna (BA).

FIG. 4I of U.S. Pat. No. 9,033,250 is exemplary, and shows a booster antenna (BA) with card antenna (CA), coupler coil (CC) and extension antenna (EA) components.

The extension antenna EA comprises two coils EA-1 and EA-2 which may be connected in series with one another, as shown. One end of the coil EA-1 is connected with an end of the coupler coil CC, the other end of the coupler coil CC may be a free end. The other end of the coil EA-2 is connected with a first end of the coil EA-2. The other end of the coil EA-2 is connected with an end of the card antenna CA, the other end of the card antenna CA may be a free end. The two coils EA-1 and EA-2 of the extension antenna EA may be laid with the same sense (both clockwise), or with opposite senses (one clockwise, the other counter clockwise). This concept can be applied to more than two extension antennas (EAs).

Reference may be made to the following patents or patent applications having booster antennas, incorporated by reference herein:

| Appln. | Filing Date | Patent No. | Publication No. | Publication Date |
|---|---|---|---|---|
| 14020884 | 8 Sep. 2013 | U.S. Pat. No. 9,033,250 | US 20140091149 | 3 Apr. 2014 |
| 14714290 | 16 May 2015 | U.S. Pat. No. 9,449,269 | US 20150356399 | 10 Dec 2015 |

| Appln. | Filing Date | Patent No. | Publication No. | Publication Date |
|---|---|---|---|---|
| 14173815 | 6 Feb. 2014 | U.S. Pat. No. 9,195,932 | US 20150021402 | 22 Jan. 2015 |
| 14564111 | 9 Dec. 2014 | — | US 20150235122 | 20 Aug. 2015 |
| 14948390 | 23 Nov. 2015 | U.S. Pat. No. 9,633,304 | US 20160118711 | 28 Apr. 2016 |
| 13600140 | 30 Aug. 2012 | U.S. Pat. No. 8,991,712 | US 20130076477 | 28 Mar. 2013 |

FIG. 4I of US 20140091149 shows a booster antenna with a single coupler coil (CC) for coupling with an antenna module (AM) and two extension antenna components (EA-1, EA-2). No modules are associated with the two extension antenna components. See also FIG. 4I of US 20150021402.

Coupling Frames

In some smartcards (SC), the booster antenna (BA) may be eliminated, and replaced by a coupling frame (CF), such as disclosed in U.S. Pat. No. 9,475,086. Generally, a coupling frame (CF) may comprise a metal layer (ML) or metal card body (MCB) having an opening (MO) for a transponder chip module (TCM) and a discontinuity, typically in the form of a slit (S) extending through the metal layer or card body from the opening to a periphery (outer edge) thereof.

Reference may be made to the following patents which disclose some examples of coupling frames.

U.S. Pat. No. 9,475,086 (25 Oct. 2016; Finn et al.)
U.S. Pat. No. 9,798,968 (24 Oct. 2017; Finn et al.)
U.S. Pat. No. 9,390,364 (12 Jul. 2016; Finn et al.)

U.S. Pat. No. 9,390,364 discloses, in FIG. 6E, a coupling frame (CF) in a card body (CB) of a smart card (SC). The coupling frame has an opening (OP) for a transponder chip module (TCM) and two additional openings in the coupling frame. The additional openings have coils, referred to as "coupler coils" disposed therein. These so-called "coupler coils" do not perform the function of traditional coupler coils (CC) of a booster antenna (BA), and there is no discussion in the '364 Patent of whether the coils are connected with anything, or with one another. There is no discussion of disposing modules in the additional openings.

No claim is being made to coupling frames or variations thereof in this patent application (and eventual patent), which is directed solely to booster antennas. Coupling frames are therefore expressly disclaimed herein.

Smartcards with Display Capability

Some smartcards have a battery, and include a display for presenting information (such as a security code, or one-time passwords) to the user. Cards having their own, internal power source may be referred to as "active" cards.

Some smartcards have a display, but use energy harvesting, rather than a battery, to power the display. See, for example, WO 2017198842 (2017-11-23; ASK). The display may be e-paper, which requires power only for changing the information on the display.

WO 2017198842 describes an interaction between a smartcard and a smartphone wherein, when the smartcard is brought into proximity with the smartphone, (i) the smartcard is powered "wirelessly" by the smartphone, and (ii) a code generated by the smartcard is displayed on a display of the smartcard. As described therein, there is a physical "wired" (or "hardwired") connection between a first circuit such as a chip (120) or a conversion module (130), and a second circuit including a display module (140). FIG. 6 therein shows an electrical connecting line (3) and a ground line (4) extending between the first circuit (120/130) and the second circuit (140).

In practice, making hardwired connections between distinct electronic components (such as circuits or modules) within the smartcard may be difficult to achieve (from a manufacturing standpoint), and may create a reliability issue. Repeated flexing of the card can compromise the connections. Consider, for example U.S. Pat. No. 7,980,477 (19 Jul. 2011; Finn) wherein, in order to effect hardwired connections between ends of an antenna in the card body and corresponding terminals of a chip module (IC), end portions of the antenna wire are formed with squiggles or meanders forming contact areas and silicon cushions are disposed under the contact areas.

SUMMARY

It is a general object of the invention to eliminate (or obviate the need for) a hardwired connection between two or more distinct, electronic circuits (or modules) within the smartcard which are physically separated from one another, and to effect the connection(s) with a wireless connection between the modules. The wireless connection may convey power and/or data between the modules. The circuits or modules may be "active", in that they require power to operate, as may be distinguished from purely passive components such as a capacitor.

In other words, a general object of the invention is to eliminate the need for a wired connection between two modules in a smartcard, such as is present in the aforementioned WO 2017198842.

When there are two distinct circuits (or separate modules) that need to communicate with one another, this may involve, at a minimum, passing signals (including data) between the two modules, both of which need to be powered. Generally, there are some possibilities, such as:

At least one of the circuits may harvest energy from an external source (such as a contactless reader, or a smartphone).

Both of the circuits may harvest energy from the external source.

One (a first) circuit may harvest energy from the external source, and the other (a second) circuit may be powered by the first circuit.

As described above, the booster antenna (BA) and module antenna (MA) are "wirelessly", connected (in communication) with one another via RF, rather than hardwired to each other. As used herein, "wireless" refers to RF-coupling, generally, and "contactless" refers to a specific protocol, such as ISO 14443 and NFC/ISO 15693.

According to the invention, generally, a wireless connection may be established between two electronic modules (M1, M2) disposed in corresponding two module openings (MO-1, MO-2) of a smartcard so that the two modules may communicate (signals, data) with each other. The connection may be implemented by a booster antenna (BA) having two coupler coils (CC-1, CC-2) disposed close to the two modules, and connected with one another. The booster antenna may also harvest energy from an external device such as a card reader, POS terminal, or a smartphone.

According to some embodiments (examples) of the invention, a smartcard may comprise: a card body (CB); a first module (M1) disposed in the card body; a second module (M2) disposed in the card body and which is physically separate from the first module; and a booster antenna (BA) disposed in the card body, wherein there is no hardwire connection between the first and second modules.

The first module (M1) may comprise a chip module (CM); and the second module may comprise a display module (DM). The chip module (CM) may be a transponder chip module (TCM) suitable for contactless or dual interface (contact and contactless) operation.

The second module (M2) may comprise a display module (DM) such as is disclosed in WO 2017198842. The second module (M2) may be an electronic module or device other than a display module (DM), such as a fingerprint sensor.

The two modules (M1, M2) may be disposed physically separate from one another in the card body, yet need to communicate with one another, and each of the two modules may require power to operate.

According to the invention, a wireless (RF) connection may be established between the first and second modules for data transfer (signaling) between the modules. The wireless connection may also be used for power transfer between the modules.

The booster antenna (BA) may comprise a card antenna (CA) component, and first and second coupler coil components (CC-1, CC-2). The two coupler coil components may be associated with the two modules (M1, M2), respectively, and the first and second coupler coils may be connected with one another and to the card antenna component.

- The first module (M1), which may be a chip module (CM) or transponder chip module (TCM), may comprise a first module antenna (MA-1).
- The second module (M2), which may be a display module (DM), may comprise a second module antenna (MA-2).
- The coupler coil (CC-1) may be disposed in proximity with the module antenna (MA-1).
- The coupler coil (CC-2) may be disposed in proximity with the module antenna (MA-2).
- The booster antenna (BA) may further comprise a card antenna (CA) component disposed about a peripheral area of the card.

According to some embodiments (examples) of the invention, a method of providing data to a second module (M2) of a smartcard (SC) may comprise from a first module (M1) of the smartcard, communicating wirelessly with the second module (M2). The first module (M1) may comprise a transponder chip module (TCM). The second module (M2) may comprise a display module (DM).

The first module (M1) and the second module (M2) may each (both) harvest energy from an external device. The external device may be an ATM or a POS terminal or a contactless card reader, or a smartphone. Only one of the modules may harvest energy from the external device, and provide energy to the other module. A third, energy-harvesting module may be provided to harvest energy from the external device and provide it to one or both of the two modules (M1, M2). Such a third module (M3) for energy harvesting may be incorporated into one or both of the other modules (M1, M2), or it may be separate from the other two modules.

In their various embodiments, the invention(s) described herein may relate to industrial and commercial industries, such RFID applications, payment smartcards, electronic passports, identity cards, access control cards, payment objects, wearable devices, smart jewelry and the like.

Other objects, features and advantages of the invention(s) disclosed herein, and their various embodiments, may become apparent in light of the descriptions of some exemplary embodiments that follows.

BRIEF DESCRIPTION OF THE DRAWINGS

Reference will be made in detail to embodiments of the disclosure, non-limiting examples of which may be illustrated in the accompanying drawing figures (FIGs). Some figures may be in the form of diagrams. Some elements in the figures may be exaggerated, others may be omitted, for illustrative clarity.

Any text (legends, notes, reference numerals and the like) appearing on the drawings are incorporated by reference herein.

Some elements may be referred to with letters ("AM", "BA", "CB", "CCM", "CM", "MA", "MT", "PA", "TCM", etc.) rather than or in addition to numerals. Some similar (including substantially identical) elements in various embodiments may be similarly numbered, with a given numeral such as "310", followed by different letters such as "A", "B", "C", etc. (resulting in "310A", "310B", "310C"), and variations thereof, and may be collectively (all of them at once) or individually (one at a time) referred to simply by the numeral ("310").

The figures presented herein may show different embodiments of RFID devices, such as smart cards or payment objects such as wearable devices. Some of the drawings may omit components such as the transponder chip module or module antenna, for illustrative clarity. Some of the figures may show only components of an RFID device, such as coupling frames.

Figure 1:
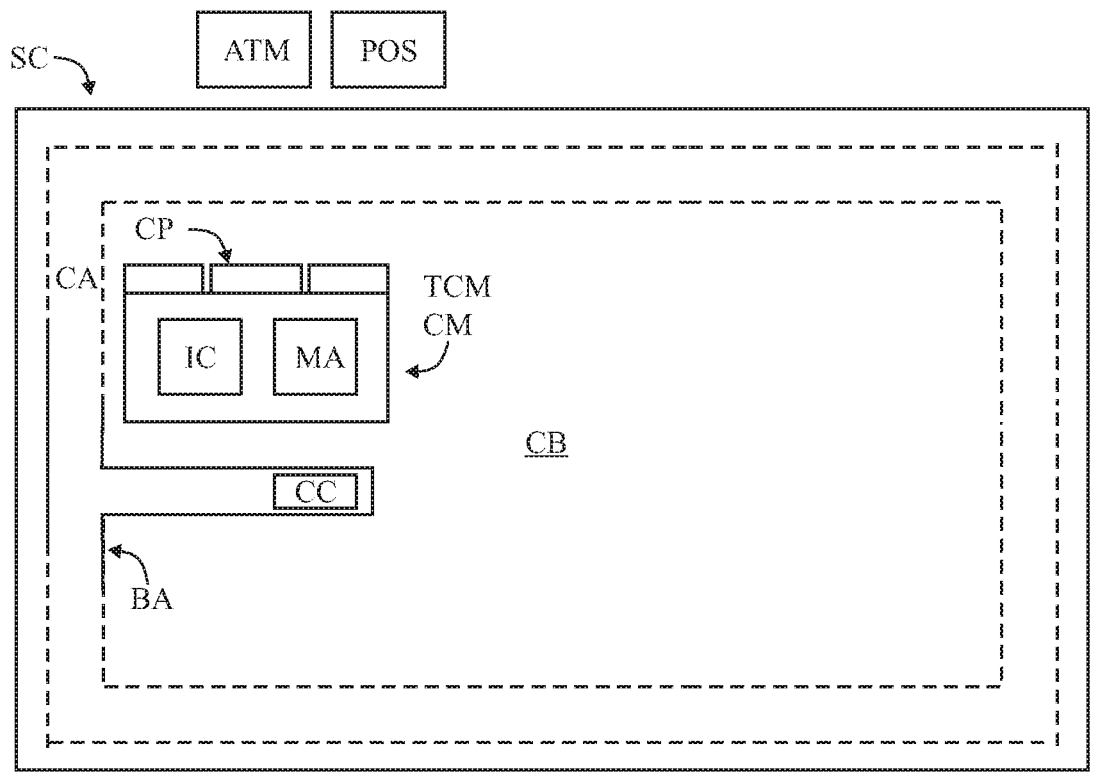

FIG. 1 is a block diagram of a typical dual-interface smartcard, having a card body (CB), a chip module (CM) and a booster antenna (BA).

Figure 2:
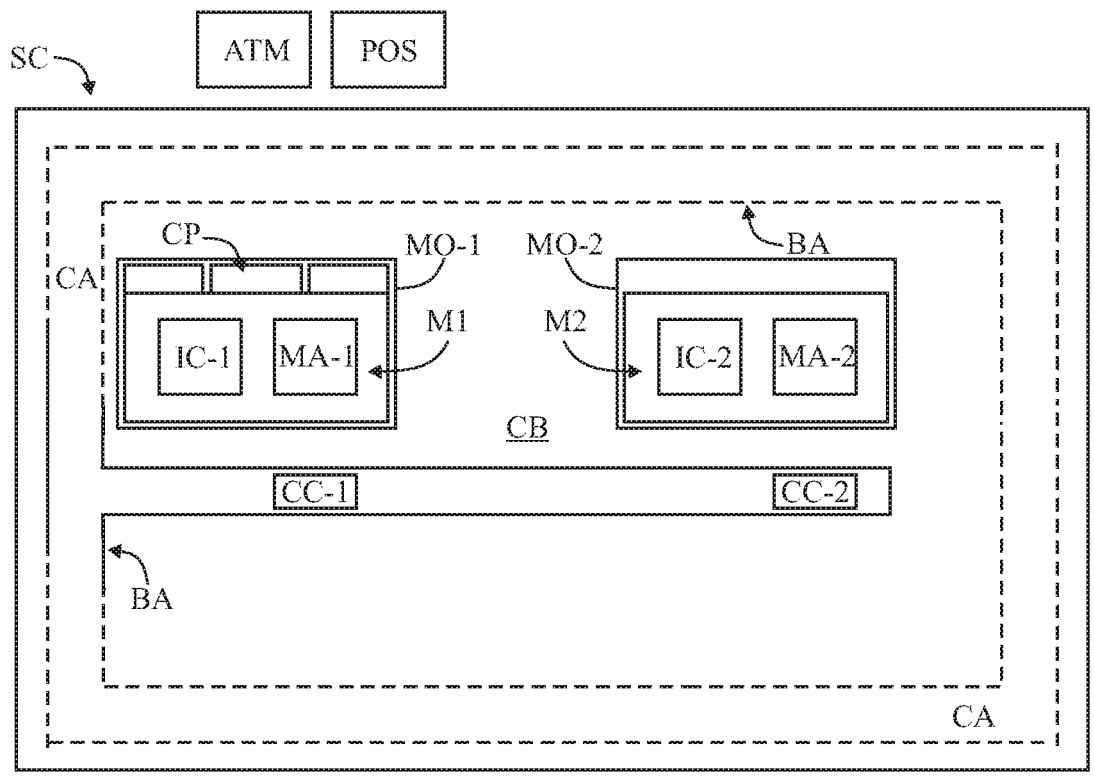

FIG. 2 is a block diagram of a smartcard having a display, according to an embodiment of the invention.

Figure 3:
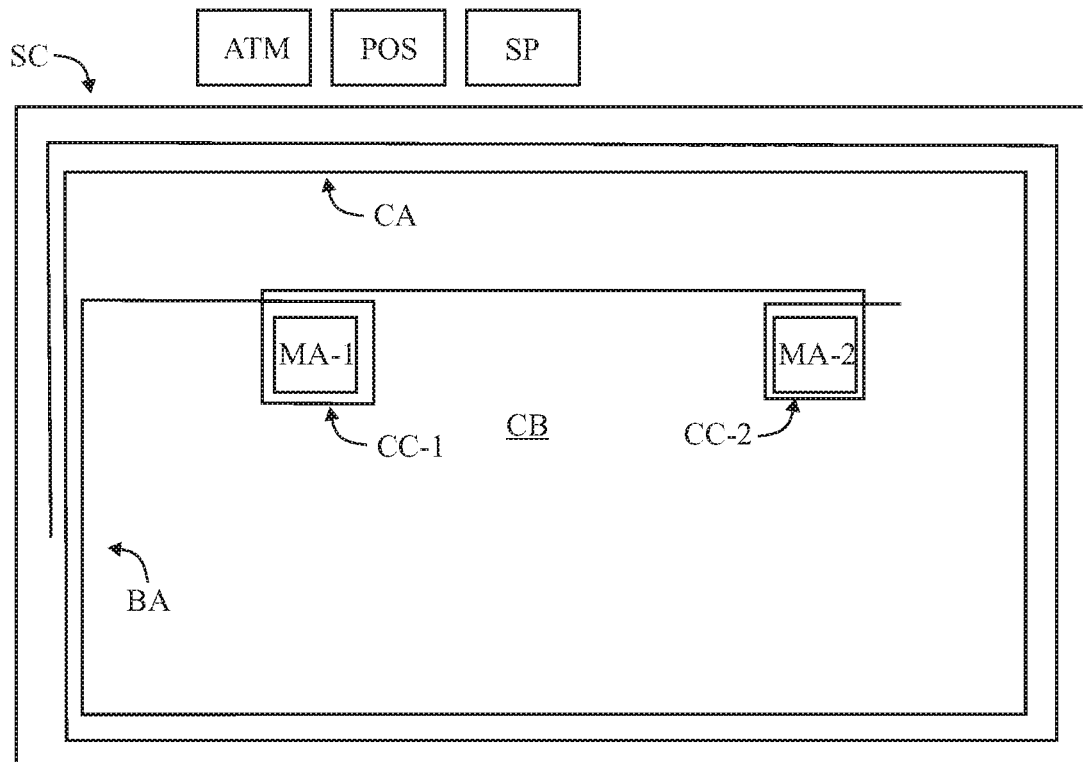

FIG. 3 is a diagram of a booster antenna having two coupler coils, according to an embodiment of the invention.

DETAILED DESCRIPTION

Various embodiments (or examples) may be described to illustrate teachings of the invention(s), and should be construed as illustrative rather than limiting. It should be understood that it is not intended to limit the invention(s) to these particular embodiments. It should be understood that some individual features of various embodiments may be combined in different ways than shown, with one another. Reference herein to "one embodiment", "an embodiment", or similar formulations, may mean that a particular feature, structure, operation, or characteristic described in connection with the embodiment is included in at least one embodiment of the present invention. Some embodiments may not be explicitly designated as such ("an embodiment").

The embodiments and aspects thereof may be described and illustrated in conjunction with systems, devices and methods which are meant to be exemplary and illustrative, not limiting in scope. Specific configurations and details may be set forth in order to provide an understanding of the invention(s). However, it should be apparent to one skilled in the art that the invention(s) may be practiced without some of the specific details being presented herein. Furthermore, some well-known steps or components may be described only generally, or even omitted, for the sake of illustrative clarity. Elements referred to in the singular (e.g., "a widget") may be interpreted to include the possibility of plural instances of the element (e.g., "at least one widget"), unless explicitly otherwise stated (e.g., "one and only one widget").

In the following descriptions, some specific details may be set forth in order to provide an understanding of the invention(s) disclosed herein. It should be apparent to those skilled in the art that these invention(s) may be practiced without these specific details. Any dimensions and materials or processes set forth herein should be considered to be approximate and exemplary, unless otherwise indicated. Headings (typically underlined) may be provided as an aid to the reader, and should not be construed as limiting.

Some processes may be presented and described in a series (sequence) of steps. It should be understood that the sequence of steps is exemplary, and that the steps may be performed in a different order than presented, some steps which are described may be omitted, and some additional steps may be omitted from the sequence and may be described elsewhere.

Reference may be made to disclosures of prior patents, publications and applications. Some text and drawings from those sources may be presented herein, but may be modified, edited or commented to blend more smoothly with the disclosure of the present application. Citation or identification of any reference should not be construed as an admission that such reference is available as prior art to the disclosure.

FIG. 1 shows a smartcard (SC) comprising a card body (CB) and a chip module (CM). The chip module (CM) comprises an integrated circuit (or semiconductor) chip (IC) and a module antenna (MA). The module antenna (MA) may be disposed around a peripheral area of the chip module (CM).

The chip module (CM) may have contact pads (CP) disposed on its front surface. Typically, there are 6 or 8 contact pads.

When the chip module (CM) is disposed in the card body (CB), the front surface and corresponding contact pads (CP) of the chip module (CM) may be coincident with the front surface of the card body (CB). The chip (IC) may be used for a financial payment application, identification or mass transit. This is sufficient to effect a "contact" interface (ISO 7816) between the smart card (SC) and contacts (not shown) of an external device, such as an automated teller machine (ATM) terminal.

The chip (IC) may comprise (not shown) various circuits and elements, such as a microprocessor and memory. The memory may comprise either or both of volatile and non-volatile memory.

The chip module (CM), comprising integrated circuit chip (IC) and module antenna (MA), may be referred to as an antenna module (AM) or as a transponder chip module (TCM). See, for example U.S. Pat. Nos. 9,475,086, 9,798, 968, 9,390,364, 9,697,459, incorporated by reference herein.

The smartcard may also comprise a booster antenna (BA). The booster antenna (BA) may comprise a card antenna (CA) component (shown in dashed lines) extending around a periphery of the card body (CB), for "contactless" coupling (ISO 14443 and NFC/ISO 15693) with an antenna (not shown) of an external device, such as a point-of-sale (POS) terminal. The booster antenna (BA) may further comprise a coupler coil (CC) component disposed at the location in the card body (CB) which is closely adjacent, including surrounding the chip module (CM), for coupling with the module antenna (MA) of the chip module (CM).

The proximity of the coupler coil (CC) with the module antenna (MA) allows the chip module to harvest energy from the external device (or reader), such as the aforementioned POS terminal, and also allows for data to be passed back-and-forth between the chip module (CM) and the external device.

The smartcard (SC) described in FIG. 1 is representative of a typical "dual interface" card of the prior art which has both "contact" and "contactless" interfaces. Such a card may also have numbers (which may be embossed) on its front surface numbers, other information (user name, bank name, hologram, etc.) visible on its front surface, and a magnetic stripe and signature panel (not shown) disposed on its back surface.

FIG. 2 shows a smartcard (SC) comprising a first electronic module (M1) and booster antenna (BA), comparable to those shown in FIG. 1. The first electronic module (M1) may be a transponder chip module (TCM) having an integrated circuit chip (IC-1) and a module antenna (MA-1). The first electronic module (M1) may be other than a transponder chip module.

The smartcard (SC) further comprises a second electronic module (M2), which may be a display module (DM) disposed in the card body (CB), and having a surface which may be substantially coincident with the front or rear surface of the card body (CB), for displaying information to the card-holder (user). The information which is displayed may include a card verification value (CVV) or one-time password (OTP) or other information which may be relevant to user of the card for initiating a transaction.

The invention is not limited to a second module which is a display module. The second module could be, for example, a fingerprint sensor, or simply an LED connected with a pickup antenna comparable to the module antenna of the chip module (CM). (This may be contrasted with U.S. Pat. No. 9,475,086, FIG. 7A, which shows an LED connected to ends of a coupling frame.)

The first and second electronic modules (M1, M2) are physically separated from one another in the card body of the smart card. Generally, the two modules may need to communicate with one another, and both modules may require power to operate. Communication may be effected without any hard-wire connection between the modules. The modules may be powered inductively, without a direct electrical connection to other components of the smart card.

The second module (M2) is physically separate (spaced-apart) and distinct from the first module (M1), is disposed in a different area of the card body than the first module (M1), and is not connected by wires to the first module (M1).

The booster antenna (BA) shown in FIG. 2 is different than the booster antenna shown in FIG. 1, in that it comprises two coupler coil (CC-1, CC-2) components, which are spaced-apart from one another.

The first coupler coil component (CC-1) may be disposed at a location in the card body (CB) aligned with the first module (M1), such as disposed directly below a module antenna (MA-1) of the first module (M1). The second coupler coil component (CC-2) may be disposed at a location in the card body (CB) aligned with the second module (DM, M1), such as disposed directly below a module antenna (MA-2) in the second module (M2). See also FIG. 3.

The first module (M1) may comprise a module antenna (MA-1) for coupling with a first of the coupler coils (CC-1), for harvesting energy, as was described with respect to FIG.

1, from an external device such as a POS terminal. The module antenna (MA-1) and coupler coil (CC-1) may be disposed in close proximity (such as aligned) with one another. The module antenna (MA-1) may be disposed around a peripheral area of the first module (M1).

The second module (M2) may comprise a module antenna (MA-2) for coupling with a second of the coupler coils (CC-2), for harvesting energy, such as from the exemplary POS terminal. The module antenna (MA-2) and coupler coil (CC-2) may be disposed in close proximity (such as aligned or overlapping) with one another. The module antenna (MA-2) may be disposed around a peripheral area of the second module (M2).

The first module (M1) may comprise an integrated circuit chip (IC-1) for managing communications with the external device (such as POS terminal), for managing communication with the second module (M2), and (optionally) for generating a CVV code. The first module (M1) may further comprise a power module, or energy harvesting circuit (not shown) for harvesting energy from the external device (such as POS terminal). The energy harvesting circuit may be incorporated into the integrated circuit chip (IC-1).

The second module (M2) may comprise an integrated circuit chip (IC-2) for managing communication with the first module (M1). The second module (M2) may further comprise a power module, or energy harvesting circuit (not shown) for harvesting energy from the external device (such as POS terminal). The energy harvesting circuit may be incorporated into the integrated circuit chip (IC-2).

A simple energy harvesting circuit may comprise a bridge rectifier (four diodes). An energy harvesting circuit may be incorporated into each of the first module (M1) and the second module (M2).

The first module (M1) and the second module (M2) may communicate with one another, via their respective module antennas (MA-1, MA-2), via the intermediary of the interconnected coupler coils (CC-1, CC-2) of the booster antenna (BA).

Additionally, energy may be harvested by each of the first module (M1) and the second module (M2) via the booster antenna (BA) and respective coupler coils (CC-1, CC-2). Both of the modules (M1, M2) may harvest energy from an external source (such as POS terminal). One of the two modules may harvest energy, and provide energy to the other module, in which case only one of the modules would need an energy harvesting circuit. A third, energy-harvesting module (not shown) may harvest energy from an external device, and provide the energy to the other two modules (M1, M2), and the booster antenna may have a third coupler coil (CC-3, not shown) associated therewith.

FIG. 3 shows an arrangement of a booster antenna (BA) in a card body (CB), wherein the booster antenna (BA) comprises a first coupler coil (CC-1) component disposed at a location of the first module (M1), and a second coupler coil (CC-2) component disposed at a location of the second module (M2). The diagram is greatly simplified, showing only a few turns (coils) of wire for each of the booster antenna components (CA, CC-1, CC-2). The two coupler coils (CC-1, CC-2) may be connected with one another, as illustrated. The two coupler coils may be wound with the same or opposite sense with respect to one another.

The booster antenna (BA) and its components (or portions) may be formed other than by embedding wire, such as by a subtractive (etching) or additive (depositing) process.

The card antenna (CA) component may be disposed around the periphery of the card body (CB), then the booster antenna (BA) may continue to the interior of the card body (CB) to form the first coupler coil (CC-1) component at the location of the module antenna (MA-1) of the chip module (CM, M1), then the booster antenna (BA) may continue across the card body (CB) to form the second coupler coil (CC-2) component at the location of the module antenna (MA-2) of the second module (M2).

A coupler coil (CC-1, CC-2) may be approximately coplanar with its respective module antenna (MA-1, MA-2), surrounding the module antenna.

Alternatively, the coupler coils (CC-1, CC-2) may be arranged above or below their respective module antennas (MA-1, MA-2) so that at least a portion of each coupler coil (CC-1, CC-2) may overlap at least a portion of its respective module antenna (MA-1, MA-2). The coupler coil (CC-1) may extend underneath (behind) the first module (M1) so that it overlaps (including completely) the module antenna (MA-1). The coupler coil (CC-2) may extend over (above) the second module (M2) so that it overlaps (including completely) the module antenna (MA-2).

As mentioned above, the module antennas (MA-1, MA-2) may be disposed around a peripheral area of their respective first module (M1) and second module (M2). And, the coupler coils (CC-1, CC-2) may be disposed in close proximity with their respective module antennas (MA-1, MA-2) including aligned directly over or under their respective module antennas (MA-1, MA-2).

The windings of the booster antenna (BA) or component elements thereof may overlap the windings of a the module antennas (MA-1, MA-2) to enhance inductive coupling, including energy transfer, and also to support the transfer of data.

In FIG. 3, one end of the card antenna (CA) component is shown as a free end (not connected with anything), and one end of the coupler coil (CC-2) is shown as a free end. These two free ends could be connected with one another, directly, or via an electronic component such as a capacitor. Other arrangements and connections are possible.

The booster antenna described herein, having coupler coils disposed at the location of two module openings may be contrasted with the teachings of U.S. Pat. No. 9,390,364. For example . . . .

In FIGS. 6C, D of U.S. Pat. No. 9,390,364 (US 2015/0136858), a coupler coil is shown at the location of a single opening (OP) for a transponder chip module (TCM).

The booster antenna disclosed herein has two coupler coils (CC-1, CC-2) associated with respective two module openings (MO-1, MO-2), at least one of, including both of which may have modules with module antennas disposed therein, and the two coupler coils are connected with one another.

In FIGS. 6E, F of U.S. Pat. No. 9,390,364, two separate and distinct coils are shown disposed in two openings in a coupling frame. The two coils are not connected with each other. Modules are not disposed in the openings The booster antenna disclosed herein has two (or more) coupler coils which are connected with one another. Electronic modules (M1, M2) are disposed in openings in the card body, at the locations of the two coupler coils (CC-1, CC-2).

FIG. 3 also shows that a smartphone (SP) may be used as an external device to power (as well as communicate with) the smartcard (SC), and its respective first, chip module (CM, M1) and second, display module (DM, M2). The use of a smartphone to power a smartcard may be disclosed in WO 2017198842.

A third, energy-harvesting module (not shown) may harvest energy from the external device and provide it to one or both of the two modules (M1, M2).

As disclosed in WO 2017198842, incorporated by reference herein, the information displayed by the display module (140) may comprise data, such as a card verification value (CVV), which may be updated (changed) on a per-transaction (per-use) basis. The CVV may be generated by the chip module (CM) within the card as a result of "pairing" of the card and a smartphone. In WO 2017198842, the display module (140) is connected by wires (3, 4) to other circuits (120, 130) in the smartcard.

In contrast with WO 2017198842, the second module (M2) is not wired to other circuits (or modules) in the card. Rather, the first module (M1) may communicate data (such as an updated CVV) wirelessly with the second module (M2) via the respective module antennas (MA-1, MA-2) which are both inductively coupled with the respective coupler coils (CC-1, CC-2) of the booster antenna (BA).

A super capacitor may be integrated into the card construction as an energy storage device.

The smartphone may run an app to synchronize a time stamp with a central server. Compare WO 2017198842.

The techniques (methods and apparatus) disclosed herein may be applied in the context of pairing with a smartphone to generate a dynamic CVV, and communicating with a bank computer server 600, such as disclosed in the aforementioned WO 2017198842 (ASK), resulting in a system for effecting banking transactions. Other applications are possible, such as cards generating one-time passwords for online banking. If the card does not have its own battery, it can be powered by a smartphone running a simple app which may (for example) simply turn on the NFC field in the phone.

The first module (M1) may comprise a transponder chip module (TCM) which may be disposed in the first module opening (MO-1). The second module opening MO-2 may be left empty, or a passive component (such as an LED) may be disposed in the second module opening (MO-2). The passive component may be connected to the second coupler coil (CC-2), or it may have its own antenna (akin to the module antenna MA-2) to receive power from the second coupler coil (CC-2).

When there is no module disposed in the second module opening (MO-2), the second coupler coil (CC-2) may nevertheless be used to increase energy harvesting. Since there are not two modules, there need not be any data transfer therebetween, only data transfer between (for example) the first module (M1) and an external reader (such as POS terminal).

While the invention(s) has/have been described with respect to a limited number of embodiments, these should not be construed as limitations on the scope of the invention(s), but rather as examples of some of the embodiments. Those skilled in the art may envision other possible variations, modifications, and implementations that are also within the scope of the invention(s), and claims, based on the disclosure(s) set forth herein.

What is claimed is:

1. Smartcard comprising:
a card body (CB);
a first electronic module (M1) disposed in the card body; and
a second electronic module (M2) disposed in the card body separate from the first module; and
a booster antenna (BA) disposed in the card body and comprising a card antenna (CA) component disposed about a peripheral area of the card, a first coupler coil (CC-1) component disposed in the card body in proximity with the first module (M1), a second coupler coil (CC-2) component disposed in the card body in proximity with the second module (M2);
wherein the first and second coupler coils are connected with one another; and
wherein there is no hardwire connection between the first and second modules.

2. Smartcard, according to claim 1, wherein:
the first and second coupler coils are hard-wire connected with one another.

3. Smartcard, according to claim 1, wherein:
there is a wireless connection between the first and second modules.

4. Smartcard, according to claim 3, wherein:
the first module comprises a first module antenna (MA-1);
the second module comprises a second module antenna (MA-2);
the first coupler coil is disposed in proximity with the first module antenna; and
the second coupler coil is disposed in proximity with the second module antenna.

5. Smartcard, according to claim 1, wherein:
the first module comprises a transponder chip module (TCM, CM); and
the second module comprises a display module (DM).

6. Smartcard, according to claim 4, wherein:
the transponder chip module is a dual-interface module having contact pads (CP).

7. Smartcard, according to claim 1, wherein:
the two modules need to communicate with one another, and both of the two modules require power to operate.

8. Smartcard, according to claim 1, wherein:
the first module (M1) is disposed in a first opening (MO-1) in the card body; and
the second module (M2) is disposed in a second opening (MO-2) in the card body.

9. Method of communicating data between two distinct electronic modules (M1, M2) of a smartcard (SC) comprising:
from a first module (M1) of the smartcard, communicating wirelessly with the second module (M2).

10. The method of claim 9, wherein:
the first module is a transponder chip module (CM, TCM).

11. The method of claim 9, wherein:
the second module is a display module (DM).

12. The method of claim 9, wherein:
the second module is a fingerprint module.

13. The method of claim 12, wherein:
the external device is an ATM or a POS terminal or a smartphone.

14. The method of claim 9, wherein:
the first module (M1) and the second module (M2) each (both) harvest energy from an external device.

15. The method of claim 9, wherein:
only one of the two modules harvests energy from an external device and provides energy to the other module.

16. The method of claim 9, wherein:
a third, energy-harvesting module harvests energy from an external device.

* * * * *